United States Patent
Braganca et al.

(10) Patent No.: US 9,459,835 B2
(45) Date of Patent: Oct. 4, 2016

(54) RANDOM NUMBER GENERATOR BY SUPERPARAMAGNETISM

(71) Applicant: HGST Netherlands B.V., Amsterdam (NL)

(72) Inventors: Patrick M. Braganca, San Jose, CA (US); Jordan A. Katine, Mountain View, CA (US); Yang Li, San Jose, CA (US); Neil L. Robertson, Palo Alto, CA (US); Qingbo Wang, Irvine, CA (US); Haiwen Xi, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 128 days.

(21) Appl. No.: 14/156,356

(22) Filed: Jan. 15, 2014

(65) Prior Publication Data

US 2015/0199177 A1 Jul. 16, 2015

(51) Int. Cl.
  *G06F 7/58* (2006.01)
  *G11B 5/74* (2006.01)
  *G11B 5/39* (2006.01)
  *G11C 11/16* (2006.01)
  *G11C 11/56* (2006.01)
  *G11B 5/00* (2006.01)

(52) U.S. Cl.
  CPC ............ *G06F 7/588* (2013.01); *G11B 5/3906* (2013.01); *G11B 5/746* (2013.01); *G11B 5/3948* (2013.01); *G11B 2005/0021* (2013.01); *G11C 11/1673* (2013.01); *G11C 11/1675* (2013.01); *G11C 11/5607* (2013.01)

(58) Field of Classification Search
  CPC ............... G11B 5/3906; G11B 5/746; G11B 2005/0021; G11C 11/1673; G11C 11/5607; G11C 11/1675

USPC .................................................. 365/158, 145
See application file for complete search history.

(56) References Cited

U.S. PATENT DOCUMENTS

| | | | |
|---|---|---|---|
| 3,962,690 A * | 6/1976 | Koenig | G11C 19/0841 365/133 |
| 6,094,572 A | 7/2000 | Sandre et al. | |
| 6,130,814 A * | 10/2000 | Sun | B82Y 25/00 257/E43.004 |
| 6,195,669 B1 | 2/2001 | Onodera et al. | |
| 7,007,060 B2 | 2/2006 | Miller, Jr. | |
| 7,613,756 B1 | 11/2009 | Zhu et al. | |
| 8,351,603 B2 | 1/2013 | Oishi et al. | |
| 8,374,021 B2 | 2/2013 | Kanai et al. | |

(Continued)

OTHER PUBLICATIONS

Ohba, R. et al., "Si Nanocrystal MOSFET with Silicon Nitride Tunnel Insulator for High-rate Random Number Generation," IEEE, Proceedings of the 2006 Emerging VLSI Technologies and Architectures (ISVLSI'06), 2006, pp. 1-6.

(Continued)

*Primary Examiner* — Vu Le
*Assistant Examiner* — Sung Cho
(74) *Attorney, Agent, or Firm* — Zilka-Kotab, PC

(57) ABSTRACT

In one general embodiment, a system includes at least one magnetic nanoparticle; a heating device for heating the at least one magnetic nanoparticle to induce a paramagnetic thermal instability in the at least one magnetic nanoparticle whereby a magnetization of the magnetic nanoparticle randomly switches between different detectable magnetic states upon heating thereof; and a magnetoresistance reading device for detecting an instantaneous magnetic state of the magnetic nanoparticle.

17 Claims, 9 Drawing Sheets

(56) References Cited

U.S. PATENT DOCUMENTS

| | | | |
|---|---|---|---|
| 2003/0222322 A1* | 12/2003 | Park | H01L 27/228 257/421 |
| 2004/0253437 A1* | 12/2004 | Ingvarsson | B82Y 25/00 428/841 |
| 2005/0110004 A1* | 5/2005 | Parkin | B82Y 25/00 257/30 |
| 2006/0077707 A1* | 4/2006 | Deak | H01L 27/228 365/171 |
| 2007/0139989 A1* | 6/2007 | Knudsen | G06F 21/87 365/48 |
| 2008/0151439 A1* | 6/2008 | Pinarbasi | B82Y 10/00 360/324.2 |
| 2008/0291721 A1* | 11/2008 | Apalkov | G11C 11/16 365/173 |
| 2009/0001983 A1* | 1/2009 | Wittkowski | G01R 33/06 324/260 |
| 2009/0073748 A1* | 3/2009 | Klostermann | G11C 11/16 365/158 |
| 2009/0186770 A1* | 7/2009 | Shi | G01R 33/098 506/6 |
| 2009/0218600 A1* | 9/2009 | Park | G06F 17/5068 257/202 |
| 2010/0091564 A1* | 4/2010 | Gao | B82Y 25/00 365/171 |
| 2010/0109660 A1 | 5/2010 | Wang et al. | |
| 2010/0131578 A1 | 5/2010 | Fukushima et al. | |
| 2010/0174766 A1 | 7/2010 | Weeks et al. | |
| 2010/0188893 A1* | 7/2010 | Zhou | B82Y 10/00 365/171 |
| 2010/0246254 A1* | 9/2010 | Prejbeanu | G11C 11/1675 365/171 |
| 2011/0241664 A1* | 10/2011 | Zhang | G01R 33/1269 324/252 |
| 2013/0022197 A1 | 1/2013 | Yamamoto et al. | |
| 2013/0051134 A1* | 2/2013 | Kawahara | G11C 11/16 365/158 |
| 2013/0073598 A1* | 3/2013 | Jacobson | G06F 7/588 708/252 |
| 2014/0067890 A1* | 3/2014 | Zhu | G06F 7/582 708/250 |
| 2014/0108478 A1* | 4/2014 | Lee | G06F 7/588 708/250 |
| 2014/0116984 A1* | 5/2014 | Ding | G11B 5/3163 216/22 |
| 2014/0136754 A1* | 5/2014 | Hyde | G06F 12/0246 711/103 |
| 2014/0339660 A1* | 11/2014 | Lee | H01L 43/08 257/421 |
| 2015/0044778 A1* | 2/2015 | Wang | G01N 27/458 436/501 |

OTHER PUBLICATIONS

Yamanashi, Y. et al., "Superconductive Random Number Generator Using Thermal Noises in SFQ Circuits," IEEE Transaction on Applied Superconductivity, vol. 19, No. 3, Jun. 2009, pp. 630-633.

Stefanou, N. et al., "High Speed Array of Oscillator-Based Truly Binary Random No. Generators," IEEE, ISCAS 2004, pp. 1-505-1508.

Jun, B. et al., "The Intel Random Number Generator," Cryptography Research, Inc. White Paper Prepared for Intel Corporation, Apr. 22, 1999, pp. 1-8.

* cited by examiner

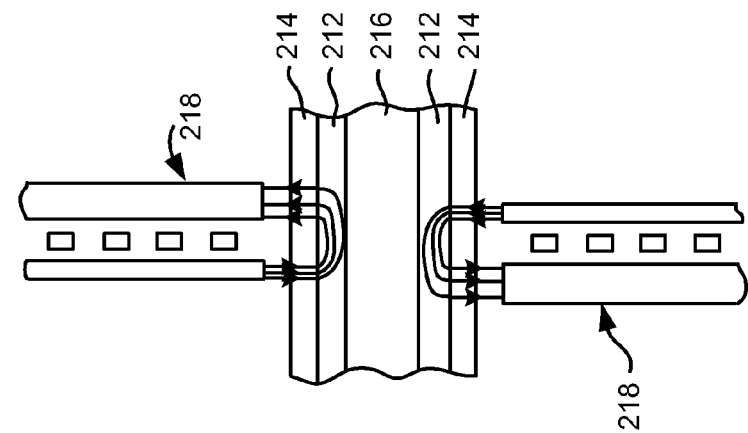
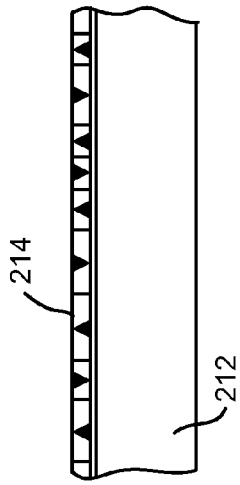
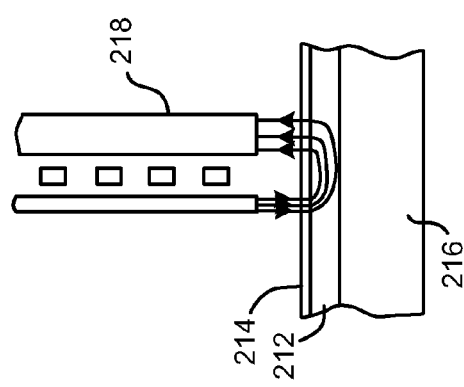
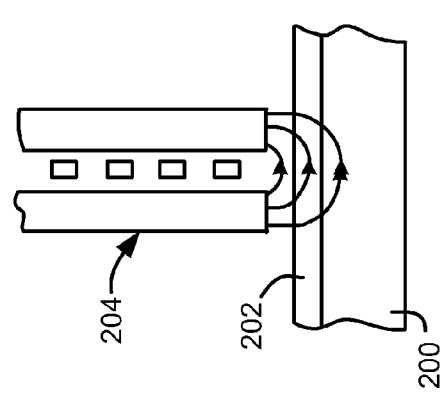

RANDOM NUMBER GENERATOR BY SUPERPARAMAGNETISM

FIELD OF THE INVENTION

The present invention relates to data storage systems, and more particularly, this invention relates to generating random numbers from the instantaneous magnetic state of a component experiencing paramagnetic thermal instability.

BACKGROUND

Random numbers have a wide application in various applications. Conventional methods of producing random numbers include two methods, the first of which includes utilizing a physical phenomenon that is expected to be random, and translate the results into random numbers. Such conventional methods include dice, coin flipping and roulette wheels. However, these methods are too slow for applications in statistics and cryptography.

The other method of producing random numbers relies on the behavior of human users of a given system. For example, some security-related computer software requires the user to make a lengthy series of mouse movements or keyboard inputs to create sufficient entropy needed to generate random keys or to initialize pseudorandom number generators. However, human subjects have some degree of non-randomness when generating a random sequence, which prevents these methods from being true random number generators.

True random number generation is desirable in some applications such as complex financial simulation, gambling, statistical sampling, cryptography, etc. Various embodiments described herein describe systems and methods of generating true random numbers using superparamagnetism as will be discussed in further detail below.

SUMMARY

A system according to one embodiment includes at least one magnetic nanoparticle; a heating device for heating the at least one magnetic nanoparticle to induce a paramagnetic thermal instability in the at least one magnetic nanoparticle whereby a magnetization of the magnetic nanoparticle randomly switches between different detectable magnetic states upon heating thereof; and a magnetoresistance reading device for detecting an instantaneous magnetic state of the magnetic nanoparticle.

A system according to another embodiment includes a pinned layer; a spacer layer above the pinned layer; a free layer above the spacer layer; a heating device, for heating the free layer to induce a paramagnetic thermal instability in the free layer whereby a magnetization of the free layer randomly switches between different detectable magnetic states upon heating thereof; and a magnetoresistance detection circuit for detecting an instantaneous magnetic state of the free layer.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods of generating true random numbers, as well as operation and/or component parts thereof. Various embodiments described herein include systems and methods of generating true random numbers by heating superparamagnetic particles, as will be discussed in detail below. Some of the embodiments herein may also facilitate the direct translation of thermal noise into binary data, e.g., 1's or 0's. Moreover, it should be noted that in any of the approaches described herein, a random number may refer to a single value/binary state random number, or a random number corresponding to a sequence of values/binary states.

In one general embodiment, a system includes at least one magnetic nanoparticle; a heating device for heating the at least one magnetic nanoparticle to induce a paramagnetic thermal instability in the at least one magnetic nanoparticle whereby a magnetization of the magnetic nanoparticle randomly switches between different detectable magnetic states upon heating thereof; and a magnetoresistance reading device for detecting an instantaneous magnetic state of the magnetic nanoparticle.

In another general embodiment, a system includes a pinned layer; a spacer layer above the pinned layer; a free layer above the spacer layer; a heating device, for heating the free layer to induce a paramagnetic thermal instability in the free layer whereby a magnetization of the free layer randomly switches between different detectable magnetic states upon heating thereof; and a magnetoresistance detection circuit for detecting an instantaneous magnetic state of the free layer.

Figure 1:
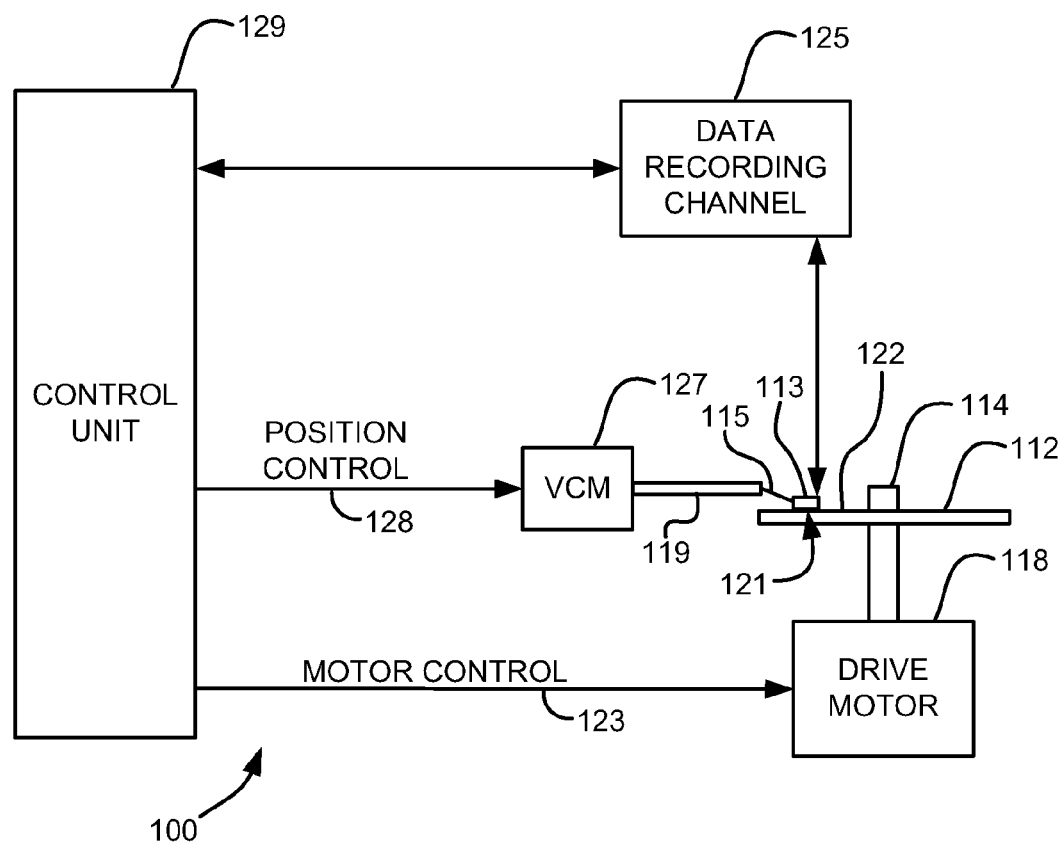
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic medium (e.g., magnetic disk) 112 is supported on a spindle 114 and rotated by a drive mechanism, which may include a disk drive motor 118. The magnetic recording on each disk is typically in the form of an annular pattern of concentric data tracks (not shown) on the disk 112. Thus, the disk drive motor 118 preferably passes the magnetic disk 112 over the magnetic read/write portions 121, described immediately below.

At least one slider 113 is positioned near the disk 112, each slider 113 supporting one or more magnetic read/write portions 121, e.g., of a magnetic head according to any of the approaches described and/or suggested herein. As the disk rotates, slider 113 is moved radially in and out over disk surface 122 so that portions 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. In a preferred approach, the control unit 129 is electrically coupled (e.g., via wire, cable, line, etc.) to the one or more magnetic read/write portions 121, for controlling operation thereof. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write portions 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write portion includes a coil layer embedded in one or more insulation layers (insulation stack), the insulation stack being located between first and second pole piece layers. A gap is formed between the first and second pole piece layers by a gap layer of the write portion at a media facing side of the head. The pole piece layers may be connected at a back gap. Currents are conducted through the coil layer, which produce magnetic fields in the pole pieces. The magnetic fields fringe across the gap at the media facing side for the purpose of writing bits of magnetic field information in tracks on moving media, such as in circular tracks on a rotating magnetic disk.

The second pole piece layer has a pole tip portion which extends from the media facing side to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

Figure 3A:
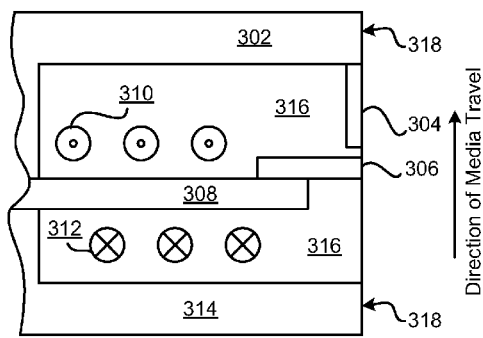
FIG. 3A is a cross-sectional view of one particular embodiment of a perpendicular magnetic head with helical coils.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the media facing side 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the media facing side 318. The media facing side 318 is indicated across the right side of the structure.

Perpendicular writing is achieved by forcing flux through the stitch pole 308 into the main pole 306 and then to the surface of the disk positioned towards the media facing side 318.

Figure 3B:
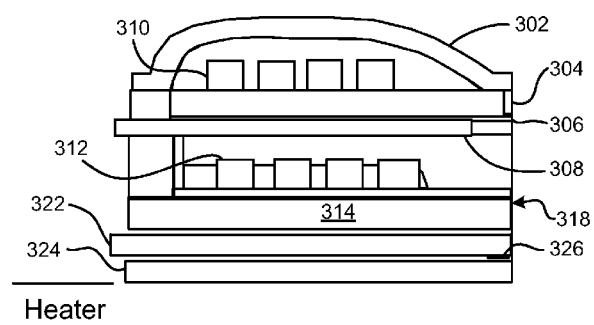
FIG. 3B is a cross-sectional view of one particular embodiment of a piggyback magnetic head with helical coils.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

Figure 4A:
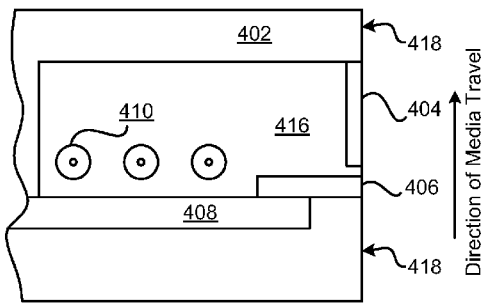
FIG. 4A is a cross-sectional view of one particular embodiment of a perpendicular magnetic head with looped coils.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the media facing side 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the media facing side 418). The media facing side 418 is indicated across the right side of the structure. The trailing shield 404 may be in contact with the main pole 406 in some embodiments.

Figure 4B:
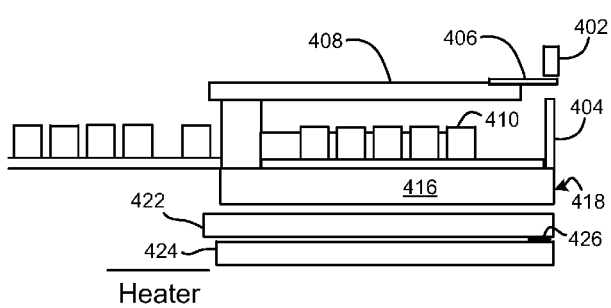
FIG. 4B is a cross-sectional view of one particular embodiment of a piggyback magnetic head with looped coils.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown away from the media facing side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Except as otherwise described herein, the various components of the structures of FIGS. 3A-4B may be of conventional materials and design, as would be understood by one skilled in the art.

As described above, various embodiments described herein include systems and methods for generating true random numbers by applying heat to superparamagnetic nanoparticles. Superparamagnetism typically occurs in small ferromagnetic or ferrimagnetic nanoparticles, the characteristics of which will be described in further detail below.

Particles having at least partial anisotropy include directionally dependent magnetization thereof. Moreover, in some instances, the orientation of a particle's directionally dependent magnetization may randomly flip direction due to thermal fluctuations. However, these random flips are associated with the characteristics of the particle. According to an exemplary embodiment, when the thermal energy (k×T) is much greater than the anisotropy energy ($K_u$×V) of a given particle, the orientation of the particle's magnetization may flip as a result of any thermal fluctuations caused to the particle as will be discussed in further detail below.

The typical time between two flips of a particle's magnetic orientation is referred to as the "Neel relaxation time". When the span of time used to measure the directional magnetization of a nanoparticle is much longer than the Neel relaxation time, the resulting average magnetization appears to be zero. However, if the magnetization of a nanoparticle is detected in a short enough time period (e.g., about instantaneously), its detectable magnetic state will be random.

Figure 5A:
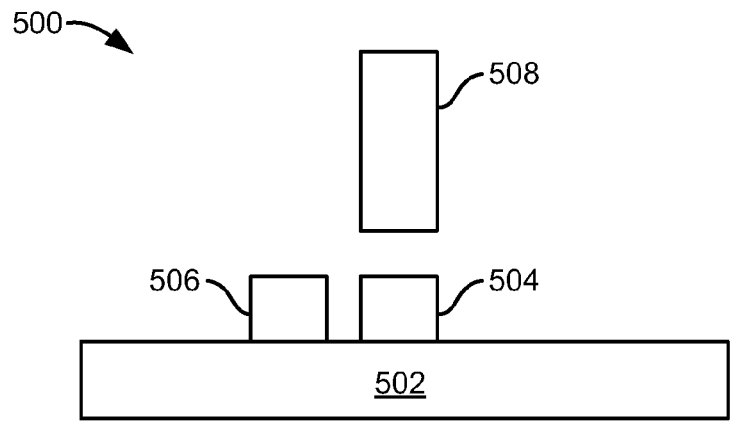
FIG. 5A is a partial cross-sectional view of a system according to one embodiment.
Figure 5B:
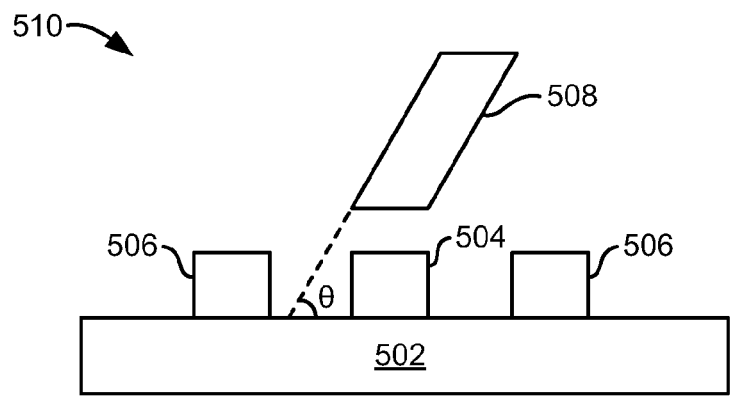
FIG. 5B is a partial cross-sectional view of a system according to one embodiment.
Figure 5C:
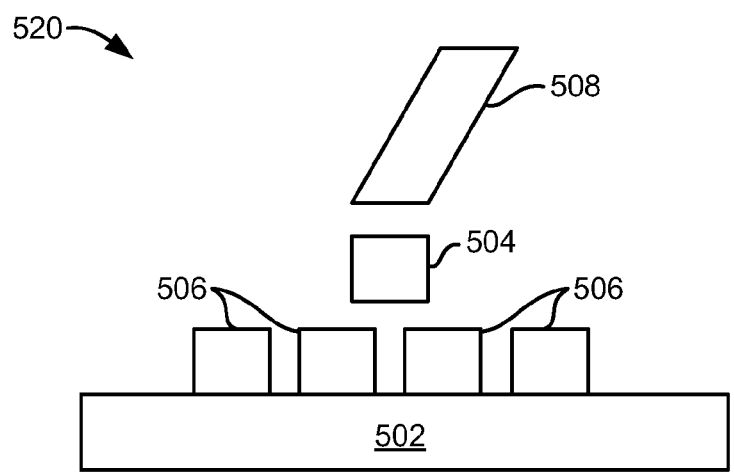
FIG. 5C is a partial cross-sectional view of a system according to one embodiment.

FIGS. 5A-5C depict systems 500, 510, 520, in accordance with several embodiments. As an option, the present systems 500, 510, 520 may be implemented in conjunction with features from any other embodiment listed herein, such as those described with reference to the other FIGS. Of course, however, such systems 500, 510, 520 and others presented herein may be used in various applications and/or in permutations which may or may not be specifically described in the illustrative embodiments listed herein. Further, the systems 500, 510, 520 presented herein may be used in any desired environment.

It should be noted that in FIGS. 5A-5C, the systems 500, 510, 520 are illustrated in different configurations. However, the different placements of the components in systems 500, 510, 520 are in no way intended to limit the invention. Accordingly, various components of FIGS. 5A-5C have common numbering.

Looking to FIGS. 5A-5C, the systems 500, 510, 520 are illustrated as including a substrate 502 and at least one magnetic nanoparticle 504 positioned above the substrate 502. According to various approaches the substrate 502 may include any conventional support system and is not limited to any particular material. Moreover, it should be noted that unless otherwise noted, any of the components herein may be constructed using conventional methods and materials as would be appreciated by one skilled in the art upon reading the present description.

As used herein, a nanoparticle 504 is preferably small enough such that the typical average length of time that it takes for the nanoparticle's magnetization to randomly flip as a result of thermal fluctuations is a few nanoseconds, but could be longer. As will be discussed in further detail below, the energy density ($K_u$) and/or volume (V) of a magnetic nanoparticle 504 may contribute to the average length of time that it takes for the nanoparticle's magnetization to randomly flip as a result of thermal fluctuations, and therefore may be used to determine the design and/or constriction of the magnetic nanoparticle 504.

In various embodiments, the magnetic nanoparticle 504 may have any number of dimensional characteristics. However, in preferred approaches, the magnetic nanoparticle 504 may have an elongated shape, e.g., such that the length of the magnetic nanoparticle 504 is greater than its width (see, e.g., L and w respectively, of FIG. 9B). In preferred embodiments, a length of the magnetic nanoparticle 504 provides an aspect ratio with respect to its width of between about 1.1 and about 3, but the ratio could be higher or lower.

By patterning the nanoparticle with an elongated shape, a uniaxial anisotropy is induced, such that the magnetic orientation of the magnetic nanoparticle 504 is influenced along its length. It follows that, in some embodiments, the magnetic nanoparticle 504 may have binary anisotropy (e.g., either longitudinal or perpendicular binary anisotropy). However, according to various other embodiments, a binary anisotropy may be influenced in the magnetic nanoparticle 504 based on materials, process steps, etc., and/or combinations thereof used to form the magnetic nanoparticle 504.

In other embodiments, the magnetic nanoparticle 504 may have random anisotropy. Referring to the present description, random anisotropy may include anisotropy such that the magnetic orientation of the magnetic nanoparticle 504 is positionable between at least three different orientations, more preferably positionable between at least five different orientations, still more preferably positionable between at least ten different orientations, but could be more.

Referring still to FIGS. 5A-5C, the systems 500, 510, 520 may include a heating device 506 and/or a magnetoresistance (MR) reading device 508. The heating device 506 is preferably for heating the magnetic nanoparticle 504; however, the heating device 506 may have additional functions, depending on the desired embodiment. According to various approaches, the heating device 506 may include a laser, near field transducer, a heating coil, etc. Furthermore, the heating device 506 may be constructed using metals such as Cu, Ag, Cr, Ru, etc., and/or combinations thereof.

The heating device 506 preferably heats the magnetic nanoparticle 504 to a point as to induce a paramagnetic thermal instability in the magnetic nanoparticle 504. This paramagnetic thermal instability desirably enhances the thermal fluctuation of the magnetic nanoparticle 504, and triggers random transitions between different detectable magnetic states. As a result, the magnetization of the magnetic nanoparticle randomly switches, or "hops" between different detectable magnetic states, e.g., based at least in part on fluctuations in environmental conditions.

According to an exemplary embodiment, a paramagnetic thermal instability may be achieved by influencing an energy state of a nanoparticle above an energy barrier determined by the size and characteristics of the nanoparticle as will soon become apparent.

As mentioned above, when the thermal energy (k×T) is much greater than the anisotropy energy ($K_u$×V) of a given nanoparticle, the orientation of the nanoparticle's magnetization may flip as a result of any thermal fluctuations caused to the nanoparticle. The anisotropy energy density $K_u$ of a nanoparticle is represented by ($\frac{1}{2}$)$M_s$×$H_k$, where $M_s$ is the saturation magnetization of the material used to form the nanoparticle, and $H_k$ denotes the nanoparticle's anisotropy field. Thus, according to different approaches, the anisotropy field of a nanoparticle may depend on $M_s$ in addition to the dimensional characteristics of the nanoparticle. As a result, the anisotropy energy $K_u$V (where V represents the volume of the nanoparticle) represents the energy barrier separating the two uniaxial anisotropy states, between which the magnetization hopping of the nanoparticle occurs.

By using the heating device 506 to heat the magnetic nanoparticle 504, the ratio $K_u$V/kT is affected. The term k represents Boltzmann's constant, while T denotes the bath temperature of the system. If this ratio is much less than one, e.g., between about 1 and about 0.01, the system enters a state where the magnetization can be thermally activated to hop from one state to the other, so that thermal fluctuations dominate the instantaneous magnetic state of the nanoparticle and desirably produce a random binary system.

Without wishing to be bound by any theory, it is believed that the lower the value of the $K_u$V/kT ratio, the lower the Neel relaxation time is, e.g., the time between random flips shortens. As a result, it may be desirable to tune the characteristics of a given system to produce a lower $K_u$V/kT ratio value (e.g., closer to 0.01) when fast Neel relaxation times are desired, while larger $K_u$V/kT ratio values (e.g., closer to 1) may be reserved for when slow Neel relaxation times are wanted. According to different approaches, the value of the $K_u$V/kT ratio may be tuned by adjusting the energy density $K_u$ of the nanoparticle, the volume V of the nanoparticle and/or the bath temperature T of the system.

In some embodiments, ferromagnetic materials with low $M_s$ values may be used to form the magnetic nanoparticle 504, e.g., to increase the generation of random magnetization fluctuations. Referring to the present description, low $M_s$ values may be from about 560 emu/cm³ to about 900 emu/cm³, but could be higher or lower depending on the desired embodiment. Moreover, illustrative materials with low $M_s$ values may include, but are not limited to, CoFe, CoFeB, CoFeGe, NiFe, etc. In other embodiments, the magnetic nanoparticle 504 may include one or more bilayers of high $M_s$ (e.g., at least higher than a low $M_s$ material) and low $M_s$ materials.

Furthermore, without wishing to be bound by any theory, to simplify the generation of random magnetization fluctuations, magnetic nanoparticles having relatively low $K_u$ values, e.g., from about 1000 J/m³ to about 50000 J/m³ may be used, but could be higher or lower depending on the desired embodiment.

With continued reference to FIGS. 5A-5C, the MR reading device 508 is able to detect the magnetization of the magnetic nanoparticle 504, thereby allowing determination of the instantaneous magnetic state of the magnetic nanoparticle 504, which in turn may be used, e.g., to generate random numbers. According to various approaches, the MR reading device 508 may include a traditional MR sensor, anisotropic magnetoresistance (AMR) sensor, giant magnetoresistance GMR sensor, tunnel magnetoresistance (TMR) sensor, etc. The MR reading device 508 may include and/or be coupled to circuitry of a type known in the art for generating data based on a sensor reading. Such circuitry may be of a type used in conventional magnetic recording systems, for example.

It follows that the MR reading device 508 may be used to determining an instantaneous and therefore random magnetic state of the magnetic nanoparticle. Moreover, the MR reading device 508 may translate the determined instantaneous magnetic state of the magnetic nanoparticle to a binary value, e.g., a "1" or "0" state, e.g., to produce a random number. However, in other embodiments, the MR reading device 508 may translate instantaneous magnetic state of a magnetic nanoparticle, e.g., having random anisotropy, to a fractional value between a "1" or "0" state.

According to one embodiment, some or all of the MR reading device 508 may be coupled to and/or built on a wafer on which any of the systems 500, 510, 520 may be formed thereon. For example, one of the aforementioned sensors may be adhered to the magnetic nanoparticle 504 and/or substrate 502 using a material known in the art, such as an intervening adhesive, an insulating layer such as alumina, etc. In another embodiment, the MR reading device 508 may be suspended above the magnetic nanoparticle 504.

In various embodiments, the orientation of the MR reading device 508 may differ, e.g., to assist in detecting the magnetization of the magnetic nanoparticle 504 based, at least in part on, the anisotropy of the magnetic nanoparticle 504. Looking specifically to FIG. 5A, a deposition plane of the MR reading device 508 is oriented substantially perpendicular to the upper surface of the substrate 502 on which the magnetic nanoparticle 504 is illustrated as being formed.

However, looking to FIG. 5B, the deposition plane of the MR reading device 508 is oriented at an angle θ relative to the upper surface of the substrate 502. According to various approaches, the angle θ at which the MR reading device 508 is oriented may vary from between about 2 degrees and about 89 degrees, depending on the desired embodiment. Without wishing to limit the invention, in some approaches, by implementing an MR reading device 508 oriented at an angle θ, the MR reading device 508 may be constructed more efficiently directly on the underlying structure, e.g., the magnetic nanoparticle and substrate. Moreover, depending on the angle θ at which the MR reading device 508 is oriented, detecting the magnetization of the magnetic nanoparticle 504 may be performed more accurately, e.g., than if the MR reading device 508 had a different orientation.

With continued reference to FIG. 5B, the system 510 includes two heating devices 506 positioned along the upper surface of the substrate 502 along with the magnetic nanoparticle 504. Although the heating devices 506 are shown as two distinct members of the system 510, in some approaches they may represent two passes of the same heating coil wrapped around the magnetic nanoparticle 504. However, according to other approaches, the heating devices 506 may include any heater type described herein, and/or combinations thereof.

Referring now to the system 520 illustrated in FIG. 5C, the magnetic nanoparticle 504 is positioned above multiple heating devices 506 that extend along the upper surface of the substrate 502. As mentioned above with reference to FIG. 5B, the heating devices 506 may, in some approaches, represent multiple passes of the same heating coil. However, according to other approaches, the heating devices 506 may include any heater type described herein, and/or combinations thereof.

With continued reference to FIG. 5C, by positioning the magnetic nanoparticle 504 above the heating devices 506, the efficiency of fabricating the system 520 may be improved. Moreover, according to some embodiments, the heating devices 506 may be at least partially isolated from the MR reading device 508, thereby preferably reducing any thermal wear that may be caused by the heating devices 506 to the MR reading device 508.

Any of the embodiments described herein may further include a controller (e.g., see 129 of FIG. 1). According to various approaches, a controller may include any number of chips, ICs, wiring networks, switches, etc., that may have additional functions.

In one approach, the controller may be for controlling the heating device 506, e.g., to heat the magnetic nanoparticle 504 to a desired energy state. In other approaches, the controller may be part of and/or for controlling the MR reading device 508 and/or a MR detection circuit (e.g., see 910 of FIG. 9A). Depending on the desired embodiment, a single controller may be used for controlling one component of a system or multiple component of a system. In other embodiments, multiple controllers may be included, each for controlling a respective component of a given system.

According to other embodiments, a controller may be used to perform one or more process steps of a method for using any of the systems described herein. According to an illustrative embodiment, FIG. 8 depicts a method 800. As an option, the present method 800 may be implemented in conjunction with features from any other embodiment listed herein, such as those described with reference to the other FIGS, such as FIGS. 5A-7. Of course, however, such method 800 and others presented herein may be used in various applications and/or in permutations which may or may not be specifically described in the illustrative embodiments listed herein. Further, the method 800 presented herein may be used in any desired environment. Thus FIG. 8 (and the other FIGS.) should be deemed to include any and all possible permutations.

Referring now to FIG. 8, the method 800 includes heating at least one magnetic nanoparticle using a heating device to induce a paramagnetic thermal instability in the at least one magnetic nanoparticle whereby a magnetization of the magnetic nanoparticle randomly hops between different detectable magnetic states. See operation 802.

As described above, a controller may be included for controlling the heating device. According to one approach, the controller may be used to control the output of the heating device to achieve the paramagnetic thermal instability in a magnetic nanoparticle. As a result, the heating device is preferably able to influence an energy state of the nanoparticle above an energy barrier determined by the size and characteristics of the nanoparticle as described above.

Looking to operation 804, the method 800 further includes detecting the instantaneous magnetic state of the at least one magnetic nanoparticle using an MR reading device. Additionally, operation 806 includes generating a random number from one or more of the instantaneous magnetic states of the magnetic nanoparticle.

As described above, a device may be used to generate a random number based, at least in part, on one or more of the instantaneous magnetic states of a magnetic nanoparticle (e.g., see 504 of FIGS. 5A-5C). According to an exemplary approach, which is in no way intended to limit the invention a device may generate a random number by translating the detected instantaneous magnetic state of a magnetic nanoparticle to a "1" or "0", which may be used as, or to produce, one or more random number(s).

The MR reading device may determine the instantaneous magnetic state of a magnetic nanoparticle at any time, e.g., upon request from a user. Moreover, to generate a random number, the MR reading device may determine the instantaneous magnetic state of a magnetic nanoparticle at several points in time that may be periodic, randomly spaced, upon request, etc. In other approaches, multiple MR reading devices and/or magnetic nanoparticles may be used to simultaneously determine several instantaneous magnetic states, e.g., to form more single value/binary state random numbers, and/or a more unique random number corresponding to a sequence of values/binary states.

Although only one MR reading device 508 is illustrated in combination with the systems 500, 510, 520 of FIGS. 5A-5C, in other approaches, additional MR reading devices may be included, e.g., two, at least two, at least three, a plurality, etc. depending on the desired embodiment. According to one approach, the additional MR reading devices may be used to generate multiple random numbers simultaneously. Moreover, the MR reading devices may be positioned with any orientation relative to each other and/or a magnetic nanoparticle of the system, depending on the desired embodiment.

Figure 6:
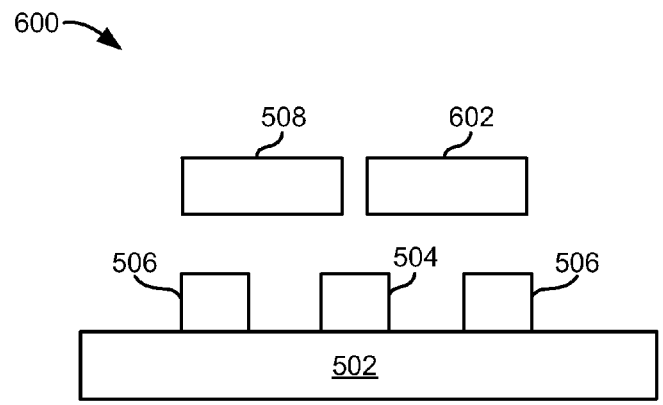
FIG. 6 is a partial cross-sectional view of a system having two magnetoresistance reading devices, according to one embodiment.

FIG. 6 depicts a system 600, in accordance with one embodiment. As an option, the present system 600 may be implemented in conjunction with features from any other embodiment listed herein, such as those described with reference to the other FIGS, such as FIGS. 5A-5C. Accordingly, various components of FIG. 6 have common numbering with those of FIGS. 5A-5C.

Of course, however, such system 600 and others presented herein may be used in various applications and/or in permutations which may or may not be specifically described in the illustrative embodiments listed herein. Further, the system 600 presented herein may be used in any desired environment.

Referring now to FIG. 6, the system 600 includes a second MR reading device 602. In some approaches, the second MR reading device 602 may be the same type (e.g., have the same construction) as the other MR reading device 508. However, in other approaches, the two MR reading devices 602, 508 may be different. For example one MR reading device 602 may be a TMR while the other MR reading device 508 is a GMR.

With continued reference to FIG. 6, the deposition planes of the MR reading devices 602, 508 are oriented along a common plane. As illustrated, the deposition planes of the MR reading devices 602, 508 are both oriented about parallel to the upper surface of the substrate 502.

However, in other embodiments the deposition planes of the MR reading devices 602, 508 may be oriented differently. According to one example, the deposition plane of one of the MR reading devices 602 may be oriented about parallel to the upper surface of the substrate 502, while the deposition plane of the other MR reading device 508 may be oriented about perpendicular to the upper surface of the substrate 502 (e.g., see FIG. 5A). Moreover, according to another example, the plane of one of the MR reading devices 602 may be oriented about parallel to the upper surface of the substrate 502, while the deposition plane of the other MR reading device 508 may be oriented at an angle relative to the upper surface of the substrate 502 (e.g., see FIG. 5B).

Some embodiments may include more than one magnetic nanoparticle, e.g., two, at least two, at least three, a plurality, etc., depending on the desired embodiment. Moreover, additional magnetic nanoparticles may be positioned with any orientation relative to each other and/or other components of the system, depending on the desired embodiment.

Figure 7:
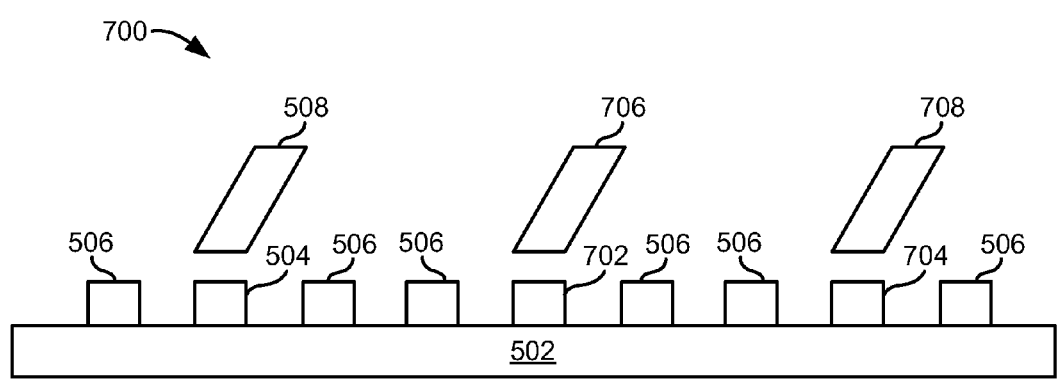
FIG. 7 is a partial cross-sectional view of a system having multiple magnetoresistance reading devices, according to one embodiment.
Figure 8:
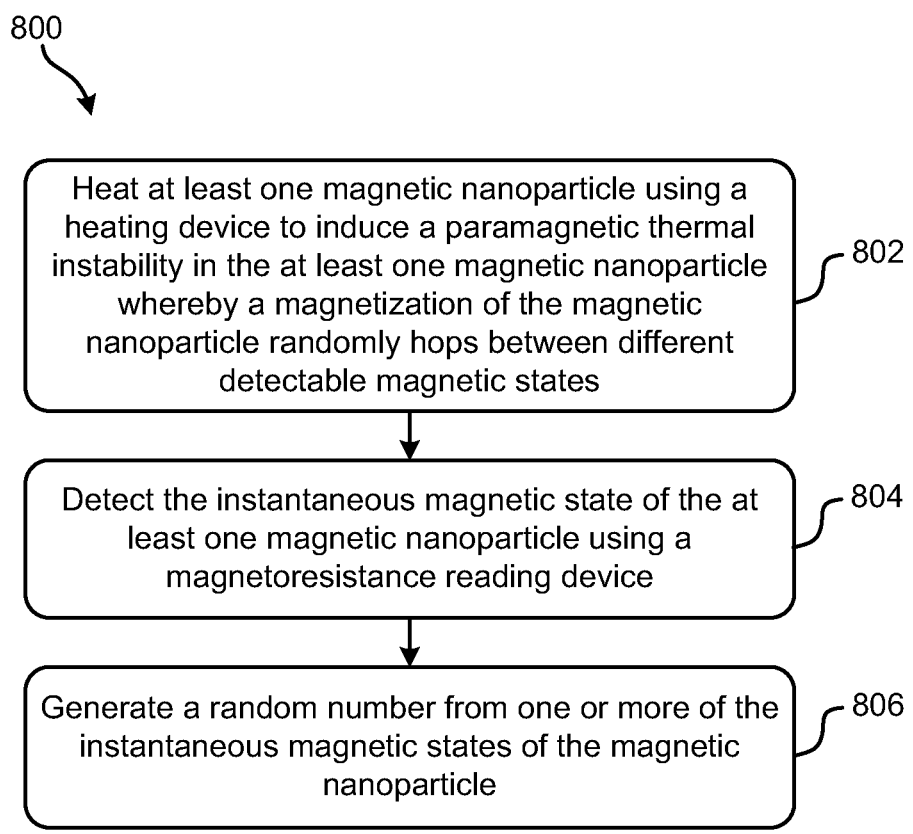
FIG. 8 is a flow chart illustrating the process steps of a method according to one embodiment.

FIG. 7 depicts a system 700, in accordance with one embodiment. As an option, the present system 700 may be implemented in conjunction with features from any other embodiment listed herein, such as those described with reference to the other FIGS, such as FIGS. 5A-5C. Accordingly, various components of FIG. 7 have common numbering with those of FIGS. 5A-5C.

Of course, however, such system 700 and others presented herein may be used in various applications and/or in permutations which may or may not be specifically described in the illustrative embodiments listed herein. Further, the system 700 presented herein may be used in any desired environment.

The system 700 illustrated in FIG. 7 includes three magnetic nanoparticles 504, 702, 704 and three MR reading devices 508, 706, 708 respectively. As mentioned above, in other approaches, fewer or more magnetic nanoparticles and/or MR reading devices may be included, depending on the desired embodiment.

With continued reference to FIG. 7, the second and third magnetic nanoparticles 702, 704 as well as the second and third MR reading devices 706, 708 extend along the substrate 502. Moreover, multiple heating devices may be present. However, according to an exemplary embodiment which is in no way intended to limit the invention, each of the heating devices 506 shown may represent passes of the same heating coil wrapped around and/or snaking through the magnetic nanoparticles 504, 702, 704.

According to an exemplary in-use embodiment, the multiple magnetic nanoparticles 504, 702, 704 and MR reading devices 508, 706, 708 may be used to generate multi-bit/multi-value random numbers and/or multiple simultaneous single bit/value random numbers.

Figure 9A:
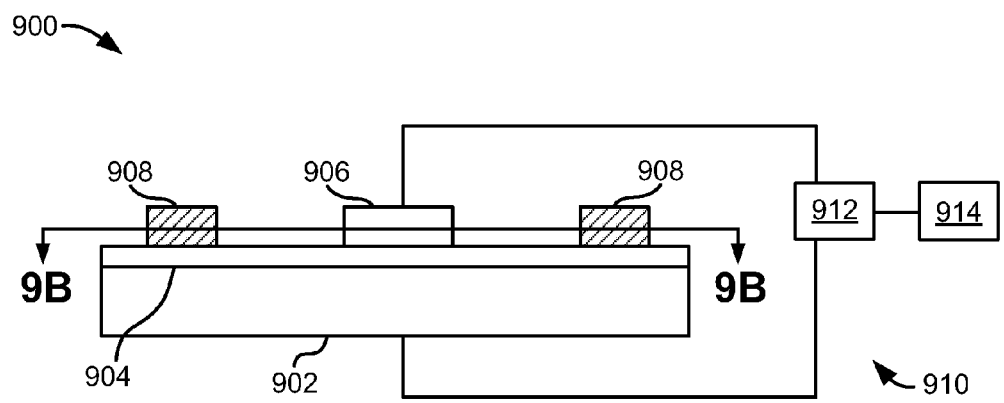
FIG. 9A is a partial cross-sectional view of a system according to one embodiment.
Figure 9B:
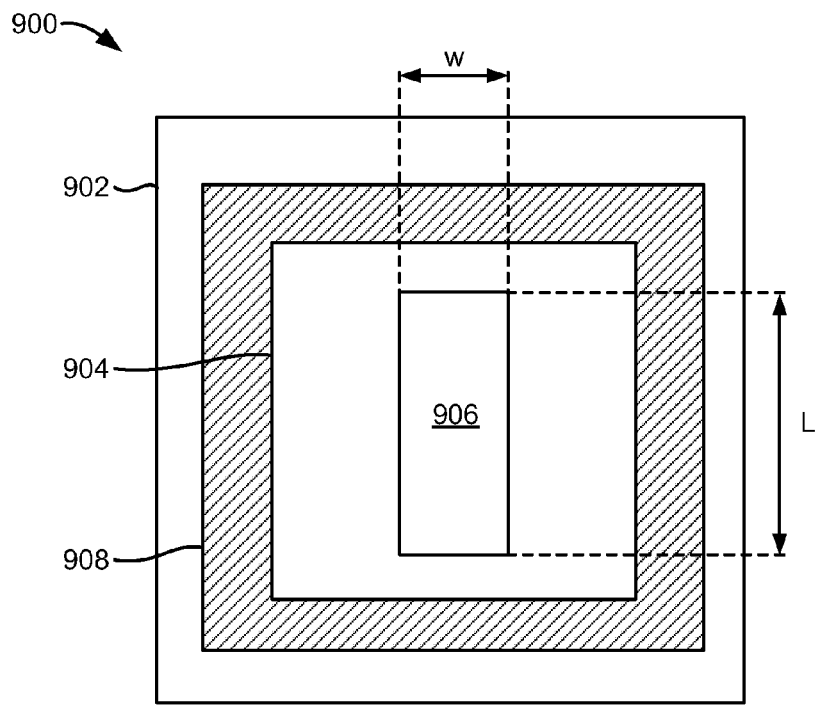
FIG. 9B is a partial top down view of the system in FIG. 9A taken along 9B-9B.

Additional system configurations and/or method steps may be used to generate truly random numbers. FIGS. 9A-9B depict a system 900 for generating truly random numbers, in accordance with one embodiment. As an option, the present system 900 may be implemented in conjunction with features from any other embodiment listed herein, such as those described with reference to the other FIGS, such as FIGS. 5A-7. Of course, however, such system 900 and others presented herein may be used in various applications and/or in permutations which may or may not be specifically described in the illustrative embodiments listed herein. Further, the system 900 presented herein may be used in any desired environment. Thus FIGS. 9A-9B (and the other FIGS.) should be deemed to include any and all possible permutations.

Referring now to FIG. 9A, the system 900 includes a pinned layer 902, a nonmagnetic spacer layer 904 above the pinned layer 902, and a free layer 906 above the spacer layer 904. According to various approaches, the pinned layer 902 may include any conventional magnetic pinned layer, e.g., a single layer of magnetic material optionally pinned by an antiferromagnet (not shown), an antiparallel (AP) pinned layer structure (also known as a synthetic pinned layer), etc. Moreover, the spacer layer 904 may be constructed using any conventional materials and/or methods as would be appreciated by one skilled in the art upon reading the present description. For example, the spacer layer may be a conductive spacer layer, or a tunnel barrier layer. Additional layers may be present, e.g., of a type conventionally used in magnetic sensors.

With continued reference to FIG. 9A, the system 900 includes a heating device 908. Similar to the embodiments described above, the heating device 908 is preferably for heating the free layer 906 to induce a paramagnetic thermal instability in the free layer 906. Moreover, as a result, a magnetization of the free layer 906 randomly hops between different detectable magnetic states.

Although the heating device 908 of the system 900 is illustrated as being similar to a heating coil, according to various other approaches, the heating device 908 may include any heating component described in any of the approaches described herein.

The system 900 also includes a MR detection circuit 910 for determining the instantaneous magnetic state of the free layer 906. As shown, the detection circuit 910 may be electrically coupled to the free layer 906 and the pinned layer 902, e.g., using a wire, cable, etc. Moreover, the MR detection circuit 910 preferably applies a current to the layered structure 902, 904, 906 (e.g., using a current supply). Moreover, the current applied to the layered structure may be used to measure the corresponding resistance (e.g., using an ohmmeter), and determine the instantaneous magnetic state of the free layer 906.

It should also be noted that, although a current perpendicular to plane (CPP) structure is shown in the present embodiment of FIGS. 9A-9B, according to other embodiments a current in plane (CIP) structure may be used to achieve the same or similar results as any of the approaches described herein.

With continued reference to FIGS. 9A-9B, the free layer 906 may include any of the properties of the magnetic nanoparticle 504 according to the various approaches described herein. As mentioned above, the length L of the free layer 906 may be greater than the width w of the free layer 906, e.g., thereby resulting in a uniaxial anisotropy. Thus, the magnetic orientation of the free layer 906 may be preferentially influenced along its length, resulting in a binary anisotropy. However, according to different approaches, the free layer 906 may have random anisotropy, e.g., when the length L and width w are approximately equal.

According to various embodiments, the width w of the nanoparticle may be from about 5 nm to about 50 nm, more preferably from about 10 nm to about 40 nm, but could be higher or lower depending on the desired embodiment. Moreover, as mentioned above, the length L may preferably be chosen as to provide an aspect ratio with respect to the width w of between about 1.1 and about 3, but could be higher or lower.

Referring still to FIGS. 9A-9B, the system 900 preferably includes a device 912 for generating a random number from one or more of the instantaneous magnetic states of the free layer 906. As a result, the device 912 may be coupled to the MR detection circuit 910 via a wire, cable, wireless connection, etc., to receive the instantaneous magnetic state of the free layer 906.

Additionally, the system 900 may further include a controller 914 according to any of the approaches described herein (e.g., see 129 of FIG. 1), preferably for controlling the heating device 908. However, in further approaches, the controller 914 may additionally and/or alternatively be used to control the detection circuit 910.

According to another approach, a controller configured like controller 914 may be used to perform one or more process steps of a method for using any of the systems described herein. According to an illustrative embodiment, FIG. 11 depicts a method 1100. As an option, the present method 800 may be implemented in conjunction with features from any other embodiment listed herein, such as those described with reference to the other FIGS, such as FIGS. 9A-10B. Of course, however, such method 1100 and others presented herein may be used in various applications and/or in permutations which may or may not be specifically described in the illustrative embodiments listed herein. Further, the method 1100 presented herein may be used in any desired environment. Thus FIG. 11 (and the other FIGS.) should be deemed to include any and all possible permutations.

Referring now to FIG. 11, the method 1100 includes heating a free layer using a heating device to induce a paramagnetic thermal instability in the free layer whereby a magnetization of the free layer randomly hops between different detectable magnetic states. See operation 1102.

According to one approach, a controller may be used to control the output of the heating device to achieve the paramagnetic thermal instability in the free layer. As a result, the heating device is preferably able to influence an energy state of the free layer above an energy barrier determined by the size and characteristics of the free layer as described above.

Looking to operation 1104, the method 1100 further includes detecting the instantaneous magnetic state of the free layer using an MR detection circuit. Additionally, operation 1106 includes generating a random number from one or more of the instantaneous magnetic states of the free layer.

As described above, a device may be used to generate a random number based, at least in part, on one or more of the instantaneous magnetic states of a magnetic nanoparticle (e.g., see 504 of FIGS. 5A-5C).

According to other embodiments, more than one layered structure may be included, e.g., two, at least two, at least three, a plurality, etc., depending on the desired embodiment. Moreover, additional layered structures and/or MR detection circuits may be positioned with any orientation relative to each other and/or other components of the system, depending on the desired embodiment.

Figure 10A:
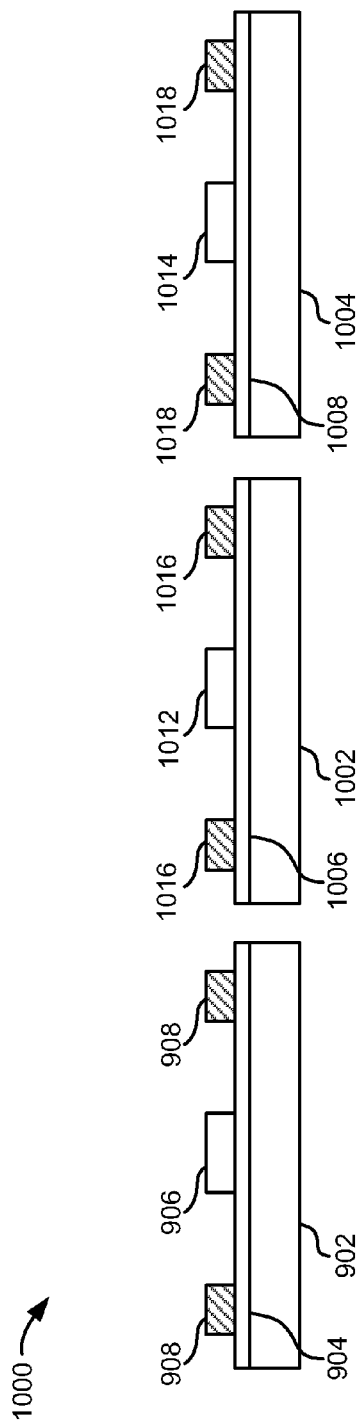
FIG. 10A is a partial cross-sectional view of a system according to one embodiment.
Figure 10B:
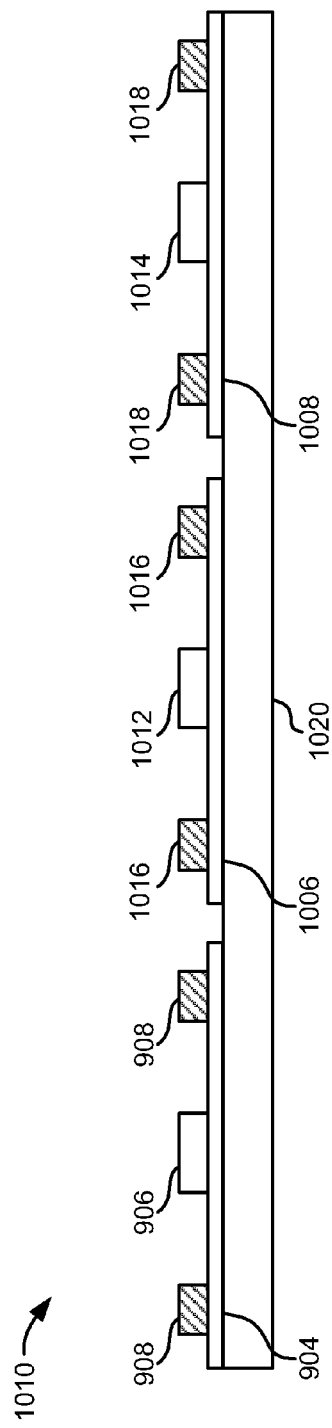
FIG. 10B is a partial cross-sectional view of a system according to one embodiment.
Figure 11:
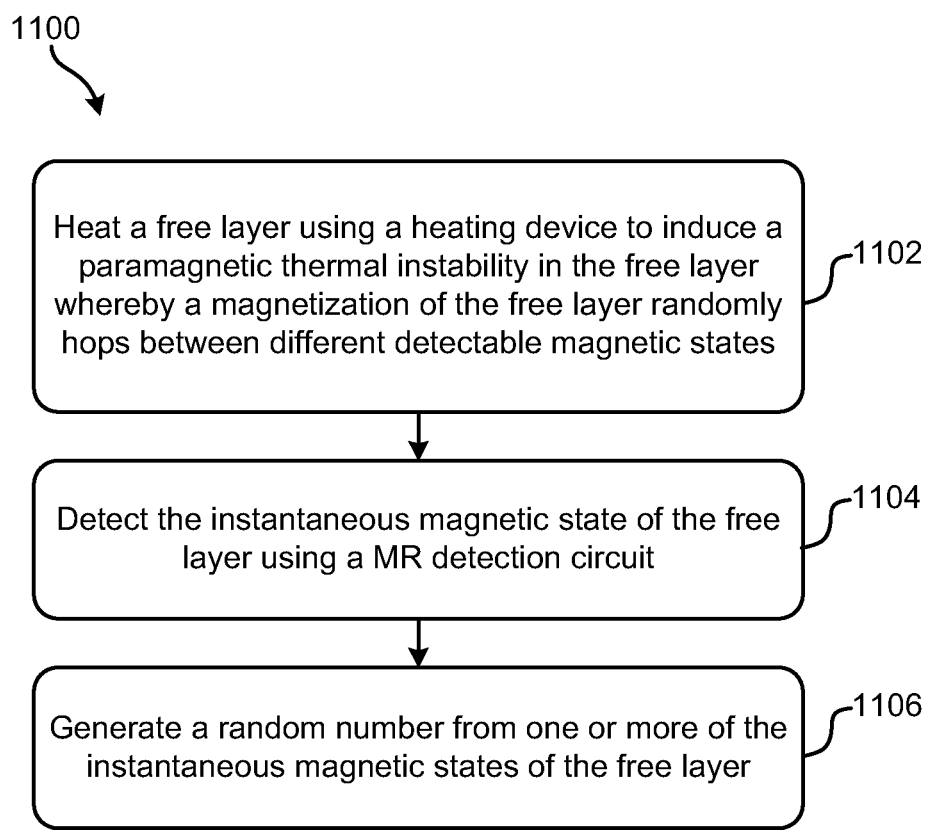
FIG. 11 is a flow chart illustrating the process steps of a method according to one embodiment.

FIGS. 10A-10B depict systems 1000, 1010, in accordance with two embodiments. As an option, the present systems 1000, 1010 may be implemented in conjunction with features from any other embodiment listed herein, such as those described with reference to the other FIGS, such as FIGS. 9A-9B. Accordingly, various components of FIGS. 10A-10B have common numbering with those of FIGS. 9A-9B.

Of course, however, such systems 1000, 1010 and others presented herein may be used in various applications and/or in permutations which may or may not be specifically described in the illustrative embodiments listed herein. Further, the systems 1000, 1010 presented herein may be used in any desired environment.

Referring to FIG. 10A, the system 1000 includes a second and third layered structure having pinned layers 1002, 1004, spacer layers 1006, 1008, and free layers 1012, 1014 respectively. Additionally, corresponding second and third heating devices 1016, 1018 as well as second and third MR detection circuits (not shown) are included with each of the layered structures.

As shown in FIG. 10A, each of the second and third layered structure have individual pinned layers 902, 1002, 1004. However, looking to FIG. 10B, each of the additional layered structures may share a common pinned layer 1020.

Moreover, the systems 1000, 1010 preferably include a device (e.g., see 912 of FIG. 9A) for generating a random number from one or more of the instantaneous magnetic states of each of the free layers 906, 1012, 1014. According some embodiments, one or both of the systems 1000, 1010 may include a device coupled to each of the layered structures, each of which may generate a random number from one or more of the instantaneous magnetic states of the corresponding free layer.

However, according to other embodiments, one or both of the systems 1000, 1010 may implement one or more devices that may be coupled to multiple layered structures. For example, the system 1000 may include a single device coupled to each of the layered structures (902, 904, 906; 1002, 1006, 1012; 1004, 1008, 1014). Thus, according to different approaches, the single device may generate one or more random numbers from one or more of the instantaneous magnetic states of the corresponding free layers 906, 1012, 1014.

It should be noted that methodology presented herein for at least some of the various embodiments may be implemented, in whole or in part, in computer hardware, software, by hand, using specialty equipment, etc. and combinations thereof.

Moreover, any of the structures and/or steps may be implemented using known materials and/or techniques, as would become apparent to one skilled in the art upon reading the present specification.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
   at least one magnetic nanoparticle;
   a heating device for heating the at least one magnetic nanoparticle to induce a paramagnetic thermal instability in the at least one magnetic nanoparticle whereby a magnetization of the magnetic nanoparticle randomly switches between different detectable magnetic states upon heating thereof; and
   a magnetoresistance reading device for detecting an instantaneous magnetic state of the magnetic nanoparticle,
   wherein the at least one magnetic nanoparticle has binary anisotropy,
   wherein a length of the at least one magnetic nanoparticle is greater than a width of the at least one magnetic nanoparticle,
   wherein a deposition plane of the magnetoresistance reading device is about parallel to a surface of a substrate upon which the at least one magnetic nanoparticle resides.

2. The system as recited in claim 1, wherein an aspect ratio between the length and width of the at least one magnetic nanoparticle is greater than or equal to about 1.1 and less than or equal to about 3.

3. The system as recited in claim 1, wherein the at least one magnetic nanoparticle has random anisotropy.

4. The system as recited in claim 1, wherein a deposition plane of the magnetoresistance reading device is oriented perpendicular to a surface of a substrate upon which the at least one magnetic nanoparticle resides.

5. The system as recited in claim 1, wherein a deposition plane of the magnetoresistance reading device is oriented at an angle relative to a surface of a substrate upon which the at least one magnetic nanoparticle resides, wherein the angle is between 2 degrees and 89 degrees.

6. The system as recited in claim 1, further comprising a second magnetoresistance reading device.

7. The system as recited in claim 1, further comprising a controller for controlling the heating device.

8. The system as recited in claim 1, further comprising a device for generating a random number from one or more of the detected instantaneous magnetic states of the at least one magnetic nanoparticle.

9. The system as recited in claim 1, further comprising at least a second magnetic nanoparticle and at least a second magnetoresistance reading device.

10. A method of using the system as recited in claim 9, comprising:
    heating the at least one magnetic nanoparticle and the at least a second magnetic nanoparticle using the heating device to induce a paramagnetic thermal instability in the at least one magnetic nanoparticle and the at least a second magnetic nanoparticle, whereby a magnetization of the at least one magnetic nanoparticle and a magnetization of the at least a second magnetic nanoparticle randomly switch between different detectable magnetic states;
    detecting the instantaneous magnetic state of the at least one magnetic nanoparticle using the magnetoresistance reading device;
    detecting the instantaneous magnetic state of the at least a second magnetic nanoparticle using the at least a second magnetoresistance reading device; and
    using one or more of the instantaneous magnetic states of the at least one magnetic nanoparticle and the at least a second magnetic nanoparticle to generate at least one of: multi-value random numbers and multiple simultaneous single value random numbers.

11. The system as recited in claim 9, wherein a deposition plane of the magnetoresistance reading device is oriented at an angle relative to a surface of a substrate upon which the at least one magnetic nanoparticle resides, wherein the angle is between 2 degrees and 89 degrees, wherein a deposition plane of the at least a second magnetoresistance reading device is oriented parallel to the deposition plane of the magnetoresistance reading device.

12. A method of using the system as recited in claim 1, comprising:
    heating the at least one magnetic nanoparticle using the heating device to induce a paramagnetic thermal instability in the at least one magnetic nanoparticle whereby a magnetization of the magnetic nanoparticle randomly switches between different detectable magnetic states;
    detecting the instantaneous magnetic state of the at least one magnetic nanoparticle using the magnetoresistance reading device; and
    generating a random number from one or more of the instantaneous magnetic states of the magnetic nanoparticle.

13. The system as recited in claim 1, wherein the magnetoresistance reading device is separated from the at least one magnetic nanoparticle.

14. The system as recited in claim 13, wherein the magnetoresistance reading device is not physically coupled to the at least one magnetic nanoparticle.

15. The system as recited in claim 1, wherein the heating device is separated from the at least one magnetic nanoparticle.

16. The system as recited in claim 15, wherein the heating device is not physically coupled to the at least one magnetic nanoparticle.

17. A system, comprising:
   at least one magnetic nanoparticle;
   a heating device for heating the at least one magnetic nanoparticle to induce a paramagnetic thermal instability in the at least one magnetic nanoparticle whereby a magnetization of the magnetic nanoparticle randomly switches between different detectable magnetic states upon heating thereof;
   a magnetoresistance reading device for detecting an instantaneous magnetic state of the magnetic nanoparticle; and
   a controller for controlling the heating device;
   wherein the at least one magnetic nanoparticle has binary anisotropy,
   wherein a length of the at least one magnetic nanoparticle is greater than a width of the at least one magnetic nanoparticle,
   wherein a width of the at least one magnetic nanoparticle is between about 5 nm and about 40 nm,
   wherein an aspect ratio between the length and width of the at least one magnetic nanoparticle is greater than or equal to about 1.1 and less than or equal to about 3,
   wherein the magnetoresistance reading device is separated from the at least one magnetic nanoparticle,
   wherein the magnetoresistance reading device is not physically coupled to the at least one magnetic nanoparticle.

* * * * *